(12) United States Patent
Wang et al.

(10) Patent No.: US 10,656,194 B2
(45) Date of Patent: May 19, 2020

(54) REAL-TIME MEASUREMENT OF A SURFACE CHARGE PROFILE OF AN ELECTROSTATIC CHUCK

(71) Applicant: APPLIED MATERIALS, INC., Santa Clara, CA (US)

(72) Inventors: Haitao Wang, Fremont, CA (US); Lawrence Wong, Fremont, CA (US); Kartik Ramaswamy, San Jose, CA (US); Chunlei Zhang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 418 days.

(21) Appl. No.: 14/924,954

(22) Filed: Oct. 28, 2015

(65) Prior Publication Data

US 2016/0116518 A1    Apr. 28, 2016

Related U.S. Application Data

(60) Provisional application No. 62/069,468, filed on Oct. 28, 2014.

(51) Int. Cl.
*G01R 29/24* (2006.01)
*H01L 21/683* (2006.01)
*H01L 21/67* (2006.01)

(52) U.S. Cl.
CPC ........ *G01R 29/24* (2013.01); *H01L 21/67253* (2013.01); *H01L 21/6833* (2013.01)

(58) Field of Classification Search
CPC .............. G01R 29/24; H01L 21/67253; H01L 21/6833
See application file for complete search history.

(56) References Cited

U.S. PATENT DOCUMENTS

| 8,148,977 | B2   | 4/2012  | Ramaswamy et al. |
| 9,435,029 | B2 * | 9/2016  | Brouk ................... C23C 14/345 |
| 2005/0284570 | A1 * | 12/2005 | Doran ....................... C23F 4/00 |
| | | | 156/345.24 |
| 2010/0090711 | A1 * | 4/2010  | Shih ..................... H01L 21/6833 |
| | | | 324/658 |
| 2010/0271744 | A1 * | 10/2010 | Ni ....................... H01L 21/6833 |
| | | | 361/233 |
| 2012/0121050 | A1 * | 5/2012  | De Geronimo ......... G01T 1/171 |
| | | | 375/354 |

\* cited by examiner

*Primary Examiner* — Patrick Assouad
*Assistant Examiner* — Feba Pothen
(74) *Attorney, Agent, or Firm* — Moser Taboada; Alan Taboada

(57) ABSTRACT

Methods and apparatus for measurement of a surface charge profile of an electrostatic chuck are provided herein. In some embodiments, an apparatus for measurement of a surface charge profile of an electrostatic chuck includes: an electrostatic charge sensor disposed on a substrate to obtain data indicative of an electrostatic charge on an electrostatic chuck; and a transmitter disposed on the substrate and having an input in communication with an output of the electrostatic charge sensor to transmit the data.

19 Claims, 5 Drawing Sheets

REAL-TIME MEASUREMENT OF A SURFACE CHARGE PROFILE OF AN ELECTROSTATIC CHUCK

FIELD

Embodiments of the present disclosure generally relate to measurement systems and methods and, more particularly, to systems and methods for determining the charge distribution on a surface of an electrostatic chuck.

BACKGROUND

Vacuum process chambers generally include a mounting chuck, for example, an electrostatic chuck that includes an electrode covered by a dielectric. In use, a DC voltage is applied to the electrode to generate an electrostatic clamping force to hold a substrate in place on the electrostatic chuck. The substrate may be, for example, a semiconductor wafer or a dielectric sheet. The force used to hold the substrate on the electrostatic chuck, known as a chucking force, is determined by the DC voltage applied to the chuck and by the distribution of electrostatic charge on the dielectric surface while the DC voltage is applied. The inventors have observed that the distribution of electrostatic charge on the dielectric surface, also referred to as a surface charge profile, impacts the subsequent process of discharging the substrate when the DC voltage is removed and the substrate is released from the mounting chuck, known as de-chucking. The presence of residual charge on the dielectric surface as a result of the incomplete discharging of the electrostatic charge may cause a substrate to break during de-chucking or may trap moisture or other chemicals on the dielectric surface that will impact subsequent processes in the process chamber.

Thus, the inventors have provided apparatus and methods to monitor or measure the electrostatic charge distribution on a dielectric surface of a chuck.

SUMMARY

Methods and apparatus for measurement of a surface charge profile of an electrostatic chuck are provided herein. In some embodiments, an apparatus for measurement of a surface charge profile of an electrostatic chuck includes: an electrostatic charge sensor disposed on a substrate to obtain data indicative of an electrostatic charge on an electrostatic chuck; and a transmitter disposed on the substrate and having an input in communication with an output of the electrostatic charge sensor to transmit the data.

In some embodiments, an apparatus for measurement of a surface charge profile of an electrostatic chuck includes: a plurality of electrostatic charge sensors disposed on a substrate to obtain data indicative of electrostatic charges on an electrostatic chuck; a processing circuit disposed on the substrate having inputs in communication with outputs of the plurality of electrostatic charge sensors to process data obtained by the electrostatic charge sensors and to output processed data; a controller disposed on the substrate having an input in communication with an output of the processing circuit; and a transmitter disposed on the substrate and having an input in communication with an output of the controller to transmit the data delivered by controller, wherein the controller is configured to at least one of analyze the processed data and deliver analyzed data to the transmitter, control operation of the transmitter, control operation of the processing circuit, control power supplied to the transmitter, or control power supplied to the processing circuit.

In some embodiments, a method of measuring a surface charge profile of an electrostatic chuck includes: measuring a voltage associated with the electrostatic charge present at a plurality of locations on the surface of the electrostatic chuck using a plurality of sensors disposed on a substrate placed on the electrostatic chuck, wherein the plurality of sensors are disposed at locations that correspond to the plurality of locations on the surface of the electrostatic chuck; and transmitting a signal based on the measured voltage using a transmitter disposed on the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
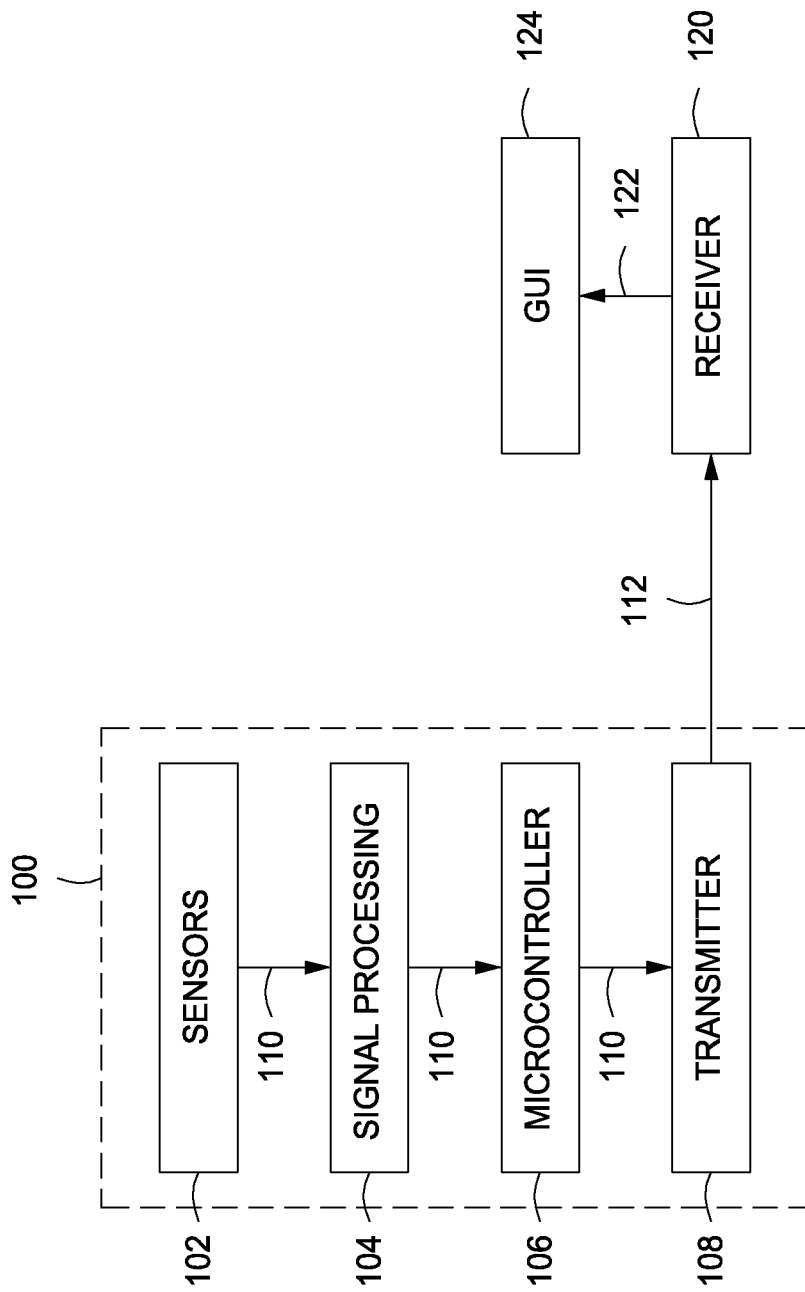
FIG. 1 is a block diagram showing an example of an electrostatic surface charge measurement system in accordance with some embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure include methods and apparatus for measurement of a surface charge profile of an electrostatic chuck. In some embodiments, the apparatus includes an electrostatic sensor array disposed on or embedded in a substrate. The electrostatic sensor array may be disposed in a predetermined arrangement, for example, evenly distributed. Data storage, communication, power, control, and analysis circuitry may be located on or embedded in the substrate or may be located elsewhere. The signal processing circuitry connecting to each of the electrostatic sensors, which may be voltage sensors, has a relatively high input resistance, e.g., about 50 MΩ to 500 MΩ, and low capacitance, e.g., about 3 pF to 30 pF, so as to advantageously not disturb, or to have a minimum impact on, the electrostatic surface charge distribution on the electrostatic chuck. The sensor signals may be stored on or off the substrate, and transmitted in real-time to a control device via a wired or wireless channel. The collected data may be analyzed and displayed in real-time. The apparatus may be applied to, but is not limited to, any vacuum process chamber that employs electrostatic chucks, such as metal or dielectric deposition process chambers, etch process chambers, or the like. Embodiments of the present disclosure also include methods of measuring a surface charge profile of an electrostatic chuck using the inventive apparatus.

FIG. 1 is a block diagram showing an example of an electrostatic surface charge measurement system. The system includes a substrate 100 sized and configured to be disposed atop an electrostatic chuck, for example, located in a vacuum chamber. For example, the substrate 100 may have the same size and shape (e.g., diameter, width and length, or the like) as a substrate that is typically processed on the electrostatic chuck to be measured.

A plurality of electrostatic sensors 102, which may be voltage sensors, are located on or embedded in the substrate 100. The plurality of electrostatic sensors 102 may be arranged in a predetermined number and pattern to measure the voltage present on the surface of an electrostatic chuck. The voltage present on the surface of the electrostatic chuck at the various locations is referred to herein as the surface charge profile of the electrostatic chuck.

Also located on or embedded in the substrate 100, or located elsewhere, may be signal processing circuitry 104 which receives a voltage or other electrical quantity measured by the electrostatic sensors 102 via signal lines 110. The signal processing circuitry 104 may convert the received voltage or other measured electrical quantity into signals representative of the measured voltage or other measured electrical quantity and which may be delivered via signal lines 110 to a microcontroller 106. The signal processing circuitry 104 connecting to the electrostatic sensors 102 has sufficiently high resistance (for example about 50 MΩ to 500 MΩ, or about 100 MΩ) and sufficiently low capacitance (for example, about 3 pF to 30 pF, or about 10 pF) so as to not disturb, or to have minimum impact on, the charge distribution on the electrostatic chuck.

The microcontroller 106 may also be located on or embedded in the substrate 100 or located elsewhere, and may deliver the signals via signal lines 110 to a transmitter 108, which may also be located on or embedded in the substrate 100 or located elsewhere. The microcontroller 106 may control the power delivered to the signal processing circuitry 104 and the transmitter 108. The transmitter 108 may be a wired transmitter or a wireless transmitter and may transmit the signals via a wired network or, as shown, a wireless network 112 (e.g., Bluetooth® or other suitable protocol) to a receiver 120. The receiver 120 may be a wired received or a wireless receiver and may be located outside of the vacuum chamber or may be located within the vacuum chamber, such as on the inner wall of the vacuum chamber. The signals received by the receiver 120 may be delivered via a connection 122 to a display 124, which may have a graphical user interface, or may be further processed and then displayed. The display 124 may display a measured charge distribution in real time (e.g., the displayed data is substantially contemporaneous with the measured charge distribution).

Figure 2:
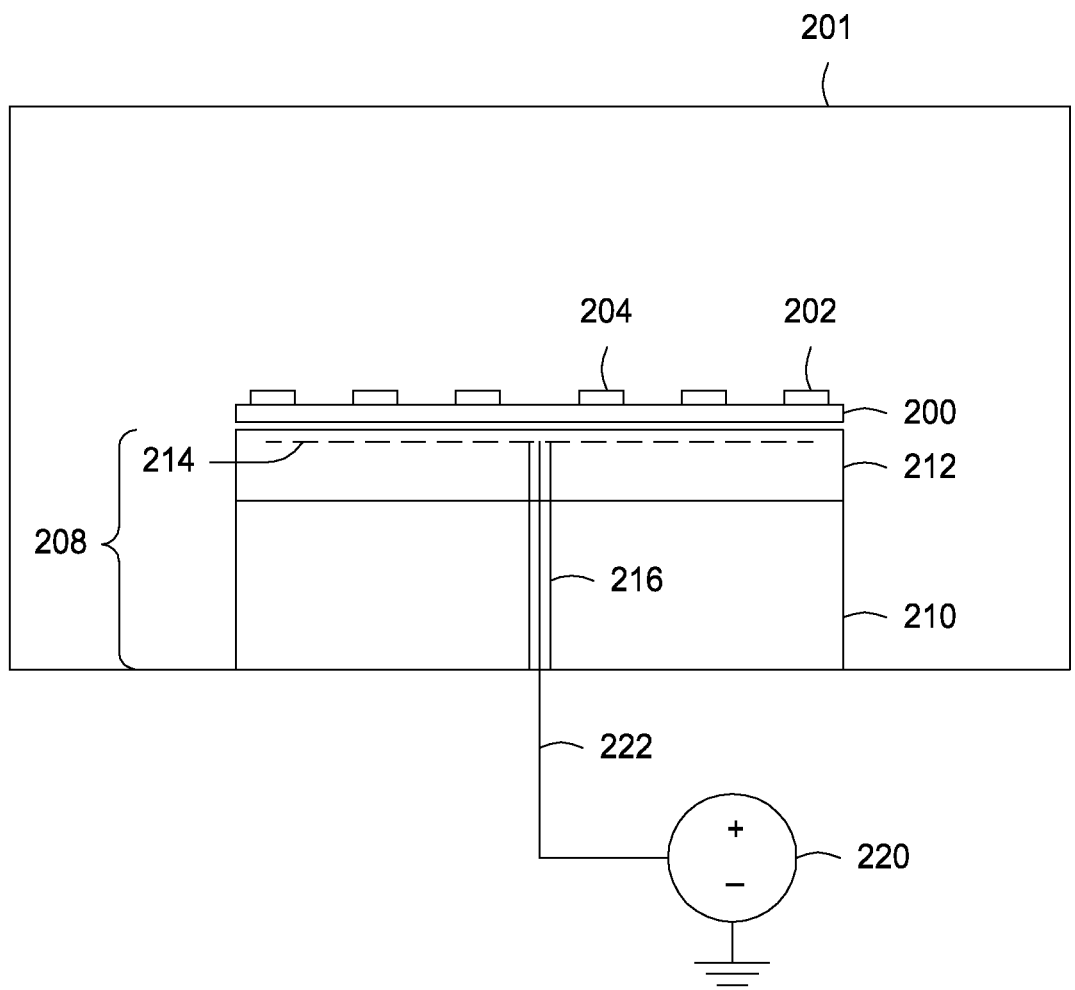
FIG. 2 is a cross-sectional view of an example of a vacuum chamber having an electrostatic chuck and on which is disposed a an electrostatic surface charge measurement system in accordance with some embodiments of the disclosure.

FIG. 2 is an example of a vacuum system 201 containing an electrostatic chuck 208 upon which a substrate 200 is disposed. Located on or embedded in the substrate 200 are a plurality of electrostatic sensors 202. Other circuit elements 204, such as the signal processing circuitry 104, microcontroller 106, and transmitter 108 shown in FIG. 1, may also be located on or embedded in the substrate 200. The electrostatic chuck 208 includes a metal layer 210 upon which a dielectric layer 212 is disposed. A power supply 220, which may be a high voltage DC or RF power supply, supplies a voltage to an electrode 214 (such as a metal mesh) embedded within the dielectric layer 212. The high voltage is delivered via a conductive line 222 that passes through the metal layer 210 via an insulator 216. The high voltage charges the electrode 214, such as with a positive charge, which induces an opposite charge, such as a negative charge, on the substrate 200 and clamps the substrate to the electrostatic chuck. The induced charge is measured by the electrostatic sensors 202 of the substrate 200 to determine the electrostatic charge at an underlying location on the surface of the dielectric layer 212 of the chuck 208. The electrostatic sensors 202 may measure the electrostatic charge present on the surface of the chuck 208 while the voltage is being applied to the electrode 214 or may measure the electrostatic charge remaining on the surface of the chuck 208 after the voltage is removed.

Figure 3A:
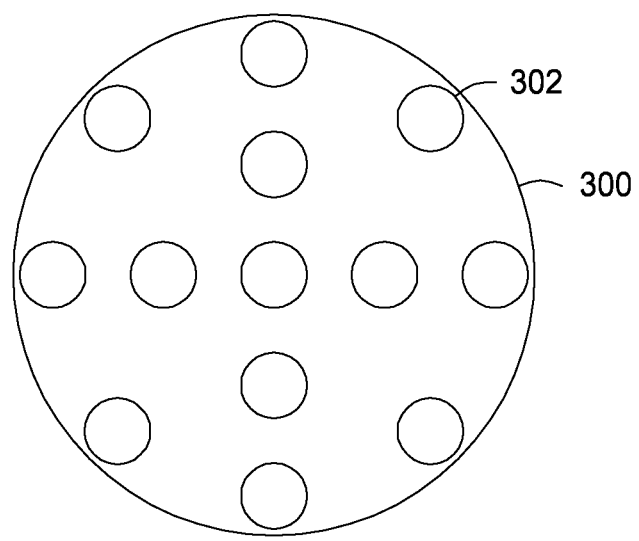
FIG. 3A is a diagram showing an example of an electrostatic sensor array located on a substrate in accordance with some embodiments of the disclosure.

FIG. 3A is an example of a substrate 300 having an array of electrostatic sensors 302. The electrostatic sensors 302 may be embedded in the substrate 300, formed atop the substrate 300, or otherwise placed or disposed atop the substrate 300. The electrostatic sensors 302 may be arranged as shown or may be arranged in other configurations and may be evenly spaced apart or irregularly spaced in a predetermined pattern. Each of the electrostatic sensors 102 may measure the electrostatic charge on the surface of the electrostatic chuck, such as at a location directly below that electrostatic sensor. The electrostatic surface charge may be measured as a voltage or as some other electrical quantity that can be correlated to the electrostatic surface charge.

Figure 3B:
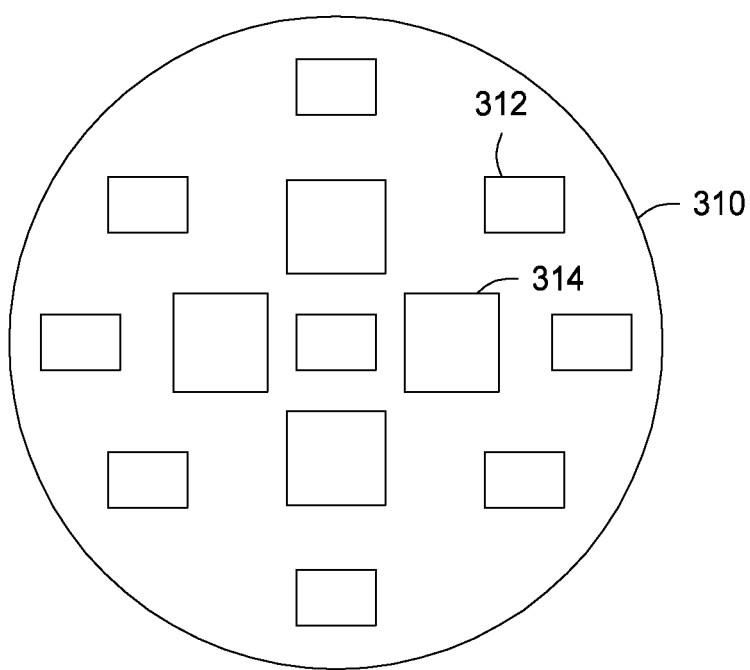
FIG. 3B is a diagram showing an example of a substrate having electrostatic sensors as well as control and transmitter blocks in accordance with some embodiments of the disclosure.

FIG. 3B is another example of a substrate 310 having an array of electrostatic sensors 312 as well as other blocks 314 which may include one or more of the signal processing circuitry 104, microcontroller 106, and transmitter 108 shown in FIG. 1. The electrostatic sensors 302 and the blocks 314 may be arranged as shown or may be arranged in other configurations and may be evenly spaced apart or irregularly spaced in a predetermined pattern. Although not explicitly shown in FIGS. 3A and 3B, other circuitry and components (for example, as discussed above with respect to FIGS. 1 and 2) may be disposed in or one the substrate 300, 310 to couple the electrostatic sensors 302, 312 and the other elements.

Figure 4:
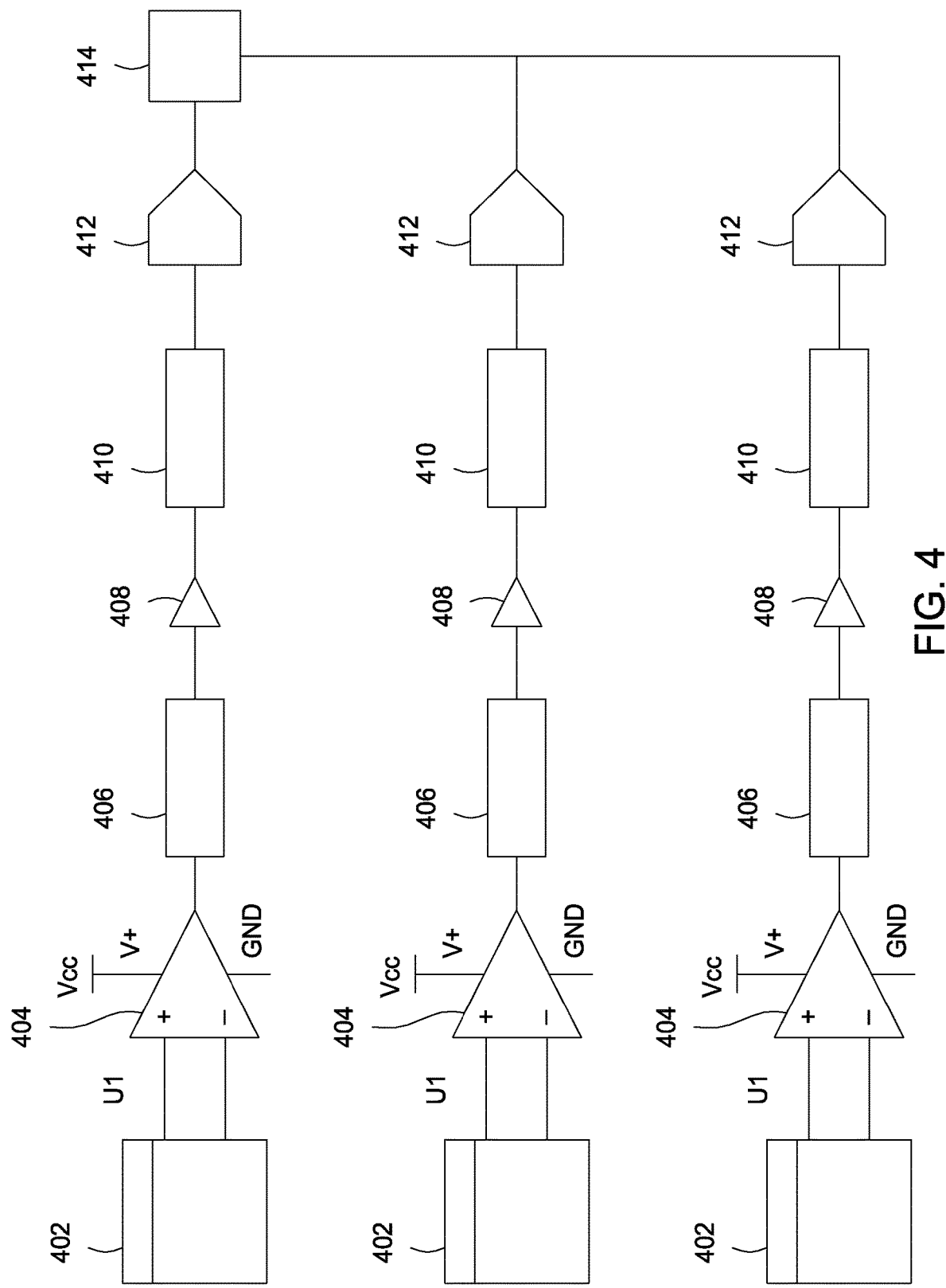
FIG. 4 is a circuit diagram showing an example of a processing circuit in accordance with some embodiments of the disclosure.

FIG. 4 is a circuit diagram showing in greater detail an example of the signal processing circuitry in accordance with embodiments of the present disclosure. An amplifier 404 may amplify a voltage measured by the electrostatic sensors 402 which may then be filtered by a low pass filter 406. The output of the low pass filter 406 may be temporarily stored in a buffer 408 and then may be delivered to a signal filter 410 for further filtering. The output of the signal filter 410 may next be delivered to an analog-to-digital converter (ADC) 412. The resulting digital signals may be delivered to a microcontroller 414 for further processing and/or delivery to a transmitter. Although a specific circuit diagram is shown in FIG. 4 for the signal processing circuitry, other configurations may also be used to deliver the data measured by the electrostatic sensors to a microcontroller in suitable form for characterizing or determining the electrostatic charge distribution on the surface of the electrostatic chuck.

Figure 5:
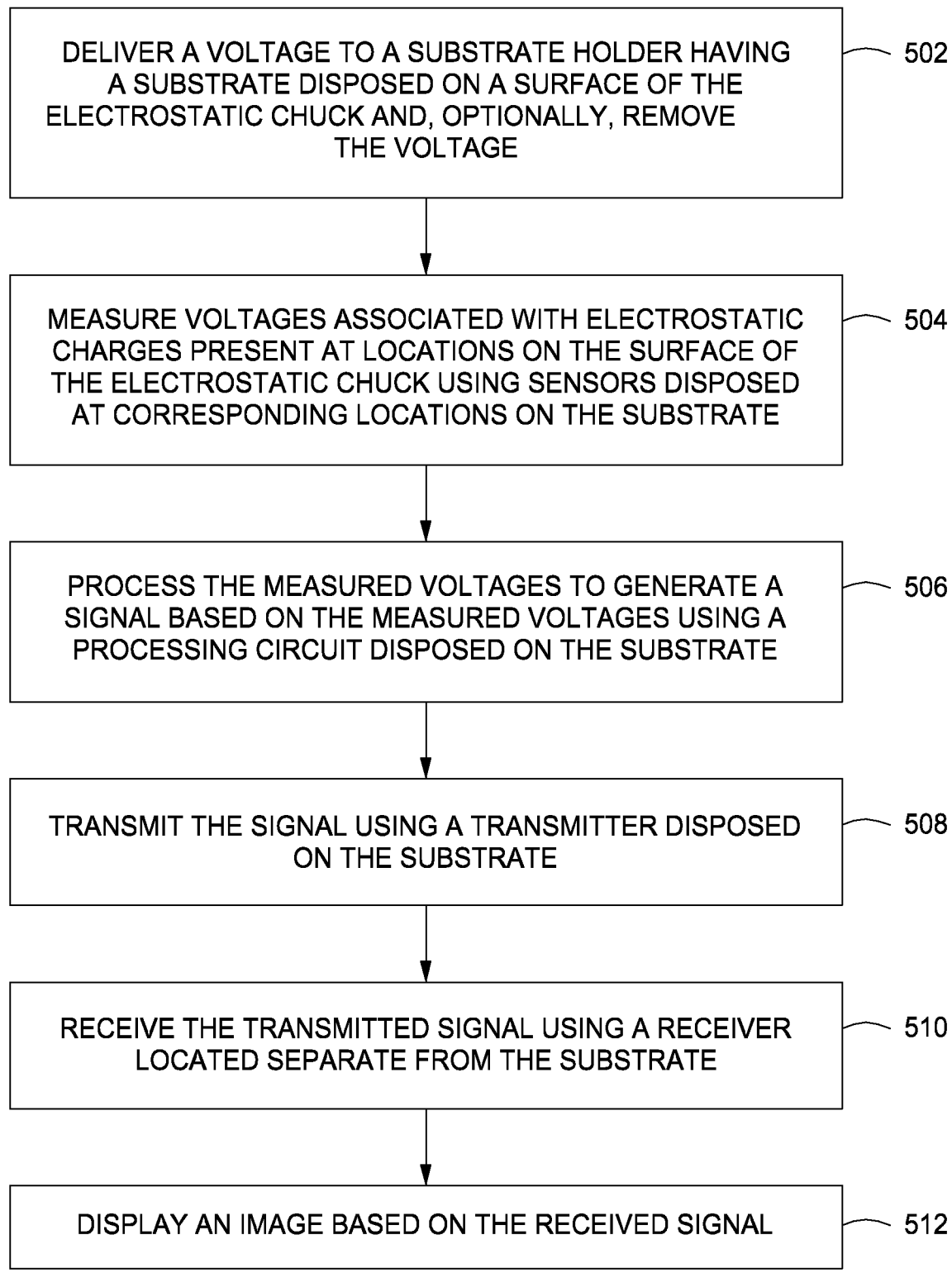
FIG. 5 is flow chart showing an example of a method of measuring a surface charge profile of an electrostatic chuck in accordance with some embodiments of the disclosure.

FIG. 5 is a flow chart depicting an example of a method of measuring a surface charge profile of an electrostatic chuck in accordance with embodiments of the present disclosure.

The method generally begins at 502, where a voltage is delivered to an electrostatic chuck having a substrate disposed on a surface of the chuck. The substrate may be any of the substrates 100, 200, 300, 310 disclosed above, or variations thereof. The voltage may be maintained, or as shown in FIG. 5, the voltage may then be removed.

Next, at 504, voltages associated with electrostatic charges present at a plurality of locations on a surface of the electrostatic chuck are measured using electrostatic sensors disposed at a plurality of locations on the substrate that correspond to (e.g., are disposed above) the plurality of locations on a surface of the electrostatic chuck. In some embodiments, the sensors may be the electrostatic sensors 102 which may be located on or embedded in the substrate 100 shown in FIG. 1, or the sensors may be the electrostatic sensors 202 of the substrate 200 shown in FIG. 2. In some embodiments, the electrostatic sensors may be the electrostatic sensors 302 which may be embedded in or formed atop the substrate 300 shown in FIG. 3A. In some embodiments, the electrostatic sensors may be the electrostatic sensors 312 which may be embedded in or formed atop the substrate 310 shown in FIG. 3B.

At 506, the measured voltages are processed to generate a signal based on the measured voltages using a processing circuit disposed on the substrate. In some embodiments, the measured voltages may be processed by signal processing circuitry 104 shown in FIG. 1. In some embodiments, the measured voltages may be processed by signal processing circuitry which may be included in the blocks 314 shown in FIG. 3B. In some embodiments, the measured voltages may be amplified by the amplifier 404 shown in FIG. 4. The amplified voltages may be filtered by the low pass filter 406. The filtered output of the low pass filter 406 may be temporarily stored in the buffer 408. The buffered signals may be further filtered output by the signal filter 410. The further filtered output of the signal filter 410 may be delivered to the ADC 412, and the analog-to digital converted signals may be delivered to the microcontroller 414.

At 508, the signal is transmitted over a wireless network using a transmitter disposed on the substrate. In some embodiments, the signals may be transmitted by a wireless transmitter (e.g., the transmitter 108 shown in FIG. 1) over a Bluetooth or other wireless network 112 which may be under the control of the microcontroller 106. In some embodiments, the signals may be transmitted by a wireless transmitter which may be included in the blocks 314 which may be embedded in or formed atop the substrate 310 shown in FIG. 3B. In some embodiments, the signals may be transmitted by a wireless transmitter which may be under the control of the microcontroller 414 shown in FIG. 4.

At 510, the transmitted signal is received using a receiver located separate from the substrate. In some embodiments, the transmitted signals may be received by a wireless receiver (e.g., the receiver 120 shown in FIG. 1) and which may be located outside of or within the vacuum chamber, such as on the inner wall of the vacuum chamber.

At 512, data based on the received signal is displayed. The data may be displayed as numeric data or an image representative of the numeric data. For example, an image may be provided showing values of the electrostatic charge in a pattern corresponding to the various measured locations on the surface of the electrostatic chuck.

The measurement of the surface charge profile of the electrostatic chuck may be performed during chucking (for example, by applying voltage to chuck the substrate to the electrostatic chuck) or during dechucking (for example, by removing voltage applied to chuck the substrate to the electrostatic chuck) processes. The measurement may be performed between processing each of several substrates in the process chamber or periodically, such as after a fixed number of substrates, after a fixed period of time, after determining or observing irregularities with chucking or dechucking of substrates, or at any other time.

While the foregoing is directed to embodiments of the present disclosure, other and further embodiments of the disclosure may be devised without departing from the basic scope thereof.

The invention claimed is:

1. An apparatus for measurement of a surface charge profile of an electrostatic chuck, comprising:
   an electrostatic charge sensor disposed on a substrate to obtain data indicative of an electrostatic charge on the electrostatic chuck;
   a processing circuit disposed on the substrate having an input in communication with the output of the electrostatic charge sensor and an output in communication with the input of a transmitter to process the data obtained by the electrostatic charge sensor and to output processed data to the transmitter, wherein the processing circuit has a relatively high input impedance and a relatively low capacitance compared to the electrostatic chuck so as not to disturb the electrostatic charge on the electrostatic chuck; and
   the transmitter disposed on the substrate to transmit the data.

2. The apparatus of claim 1, wherein the electrostatic charge sensor is a voltage sensor.

3. The apparatus of claim 1, wherein the processing circuit further comprises:
   an amplifier having an input in communication with the input of the processing circuit and an output in communication with the output of the processing circuit to amplify the data obtained by the electrostatic charge sensor.

4. The apparatus of claim 1, wherein the processing circuit further comprises:
   a filter having an input in communication with the input of the processing circuit and an output in communication with the output of the processing circuit.

5. The apparatus of claim 1, wherein the processing circuit further comprises:
   an analog-to-digital converter having an input in communication with the input of the processing circuit and an output in communication with the output of the processing circuit.

6. The apparatus of claim 1, further comprising:
   a controller disposed on the substrate having an input in communication with the output of the electrostatic charge sensor and an output in communication with the input of the transmitter to at least one of analyze the data and deliver analyzed data to the transmitter, control operation of the transmitter, control operation of a processing circuit having an input in communication with the output of the electrostatic charge sensor and an output in communication with the input of the controller, control power supplied to the transmitter, or control power supplied to the processing circuit.

7. The apparatus of claim 6, wherein the transmitter is a wireless transmitter.

8. The apparatus of claim 1, wherein the substrate comprises a semiconductor wafer.

9. The apparatus of claim 1, further comprising:
a receiver to receive the transmitted data.

10. The apparatus of claim 9, further comprising:
a display to display an image based on the received data.

11. The apparatus of claim 1, wherein the electrostatic charge sensor comprises a plurality of electrostatic charge sensors disposed on the substrate.

12. The apparatus of claim 11, wherein plurality of electrostatic charge sensors are evenly embedded on the substrate.

13. An apparatus for measurement of a surface charge profile of an electrostatic chuck, comprising:
a plurality of electrostatic charge sensors disposed on a substrate to obtain data indicative of electrostatic charges on the electrostatic chuck;
a processing circuit disposed on the substrate having inputs in communication with outputs of the plurality of electrostatic charge sensors to process data obtained by the electrostatic charge sensors and to output processed data, wherein the processing circuit has an input impedance of about 50 mega ohms to 500 mega ohms and a capacitance of about 3 pico farads to 30 pico farads so as not to disturb the electrostatic charge on the electrostatic chuck;
a controller disposed on the substrate having an input in communication with an output of the processing circuit; and
a transmitter disposed on the substrate and having an input in communication with an output of the controller to transmit the data delivered by controller, wherein the controller is configured to at least one of analyze the processed data and deliver analyzed data to the transmitter, control operation of the transmitter, control operation of the processing circuit, control power supplied to the transmitter, or control power supplied to the processing circuit.

14. A method of measuring a surface charge profile of an electrostatic chuck, comprising:
measuring a voltage associated with an electrostatic charge present at a plurality of locations on a surface of the electrostatic chuck using a plurality of sensors disposed on a substrate placed on the electrostatic chuck, wherein the plurality of sensors are disposed at locations that correspond to the plurality of locations on the surface of the electrostatic chuck, wherein each of the plurality of sensors has a resistance and capacitance selected so as not to disturb the electrostatic charge on the electrostatic chuck;
processing the measured voltage using a processing circuit having a relatively high input impedance and a relatively low capacitance compared to the electrostatic chuck so as not to disturb the electrostatic charge on the electrostatic chuck; and
transmitting a signal based on the measured voltage using a transmitter disposed on the substrate.

15. The method of claim 14, further comprising:
delivering a further voltage to the electrostatic chuck, wherein the measuring measures the voltage associated with electrostatic charge induced at the location on the substrate by the further voltage.

16. The method of claim 15, further comprising:
removing the further voltage from the electrostatic chuck, wherein the measuring measures the voltage associated with electrostatic charge remaining at the location on the substrate after the further voltage is removed.

17. The method of claim 14, further comprising:
receiving the transmitted signal using a receiver that is not located on the substrate; and
displaying an image based on the received signal.

18. The method of claim 17, wherein the image is displayed substantially contemporaneously with the measured voltage.

19. The method of claim 14, further comprising:
controlling the transmitter using a controller disposed on the substrate.

\* \* \* \* \*